(12) United States Patent
Yoshida

(10) Patent No.: US 9,648,759 B2
(45) Date of Patent: May 9, 2017

(54) MULTILAYER WIRING BOARD AND METHOD FOR MANUFACTURING SAME

(71) Applicant: HITACHI CHEMICAL COMPANY, LTD., Tokyo (JP)

(72) Inventor: Nobuyuki Yoshida, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/027,784

(22) PCT Filed: Sep. 24, 2014

(86) PCT No.: PCT/JP2014/075255
§ 371 (c)(1),
(2) Date: Apr. 7, 2016

(87) PCT Pub. No.: WO2015/053082
PCT Pub. Date: Apr. 16, 2015

(65) Prior Publication Data
US 2016/0242278 A1 Aug. 18, 2016

(30) Foreign Application Priority Data

Oct. 9, 2013 (JP) .................................. 2013-211871
Jul. 18, 2014 (JP) .................................. 2014-147754
Jul. 18, 2014 (JP) .................................. 2014-147755

(51) Int. Cl.
*H05K 1/09* (2006.01)
*H05K 3/46* (2006.01)
(Continued)

(52) U.S. Cl.
CPC ........... *H05K 3/4652* (2013.01); *H05K 3/421* (2013.01); *H05K 3/0035* (2013.01); *H05K 3/0038* (2013.01); *H05K 3/422* (2013.01)

(58) Field of Classification Search
CPC ... H05K 1/11; H05K 3/00; H05K 3/07; H05K 3/38; H05K 3/42; H05K 3/55; H01L 21/70; H01L 23/48; H01L 23/49
(Continued)

(56) References Cited

U.S. PATENT DOCUMENTS 6,448,506 B1 *  9/2002  Glenn ................. H01L 23/3128
                                                    174/260
6,564,454 B1 *  5/2003  Glenn ............... H01L 23/49572
                                                    257/E21.705
(Continued)

FOREIGN PATENT DOCUMENTS

JP    2003318544 A    11/2003
JP    2007180359 A     7/2007
(Continued)

OTHER PUBLICATIONS

International Search Report of Appln. No. PCT/JP2014/075257 dated Oct. 21, 2014 in English.
(Continued)

*Primary Examiner* — Xiaoliang Chen
(74) *Attorney, Agent, or Firm* — Fitch Even Tabin & Flannery, LLP

(57) ABSTRACT

The present invention is a multilayer wiring board and a method for manufacturing the same, the multilayer wiring board having a hole for interlayer connection penetrating a metal foil and an insulating layer; an overhang of the metal foil formed at an opening of the hole; lower space formed between the overhang and an inside wall of the hole; and interlayer connection in which the hole is filled with electrolytic filling plating layers, wherein the electrolytic filling plating layers are formed as at least two or more layers, the lower space is filled with any electrolytic filling plating layer except for an outermost layer of the two or more layers of electrolytic filling plating layers, and a diameter in the inside
(Continued)

of the interlayer connection formed by any electrolytic filling plating layer except for an outermost layer is equal to or larger than a diameter of the opening.

5 Claims, 7 Drawing Sheets

(51) Int. Cl.
*H05K 3/42* (2006.01)
*H05K 3/00* (2006.01)

(58) Field of Classification Search
USPC ...... 174/251, 260–262, 264; 216/13, 17, 18; 29/852; 205/674, 721, 772
See application file for complete search history.

(56) References Cited

U.S. PATENT DOCUMENTS

| | | | | |
|---|---|---|---|---|
| 6,708,404 B1 * | 3/2004 | Gaku | ................... | H05K 3/0038 216/17 |
| 7,521,806 B2 * | 4/2009 | Trezza | .............. | H01L 21/76898 257/774 |
| 7,666,320 B2 * | 2/2010 | Kawamura | .......... | H05K 3/0038 134/2 |
| 8,366,903 B2 * | 2/2013 | Kawamura | .......... | H05K 3/0038 205/674 |
| 8,541,695 B2 * | 9/2013 | Ishida | ................. | H05K 1/0222 174/260 |

FOREIGN PATENT DOCUMENTS

| | | |
|---|---|---|
| JP | 2008182273 A | 8/2008 |
| JP | 2009021581 A | 1/2009 |
| JP | 2009117448 A | 5/2009 |
| JP | 2013077807 A | 4/2013 |
| JP | 2013077809 A | 4/2013 |

OTHER PUBLICATIONS

International Search Report of Appln. No. PCT/JP2014/075255 dated Oct. 28, 2014 in English.

* cited by examiner

Step(3-1)

Step(3-2)

Step(3-3)

Step(2-1)

Step(2-2)

Step(2-3)

Step(2-1)

Step(2-2)

MULTILAYER WIRING BOARD AND METHOD FOR MANUFACTURING SAME

CROSS-REFERENCE TO RELATED APPLICATIONS

This application is a U.S. national phase application filed under 35 U.S.C. §371 of International Application No. PCT/JP2014/075255, filed Sep. 24, 2014, designating the United States, which claims priority from Japanese Patent Application Nos. 2013-211871, 2014-147754, and 2014-147755, filed Oct. 9, 2013, Jul. 18, 2014, and Jul. 18, 2014, respectively, which are hereby incorporated herein by reference in their entirety.

TECHNICAL FIELD

The present invention relates to a multilayer wiring board and a method for manufacturing the same and particularly relates to a multilayer wiring board in which interlayer connection is formed by using an electrolytic filling plating solution, and a method for manufacturing the same.

BACKGROUND ART

Heretofore, a multilayer wiring board has been adopted by integrally laminating a prepreg or a resin film on a wired inner layer material, and a metal foil as an upper layer thereof, creating a hole for interlayer connection by laser to form a base electroless plating layer, and then filling in the hole for interlayer connection with an electrolytic plating layer formed by using an electrolytic filling plating solution (hereinafter, also simply referred to as an "electrolytic filling plating layer").

In this respect, particularly, for a hole for interlayer connection whose via diameter is nearly equal, i.e., aspect ratio is approximately 1, or more compared with the insulating layer thickness, there is a tendency that a plating void (hereinafter, also simply referred to as a "void") easily occurs in the inside of the via. A multilayer wiring board to which an electrolytic plating method that is carried out for a long time at a low electric current density or an electrolytic plating method with an electric current density controlled in stages is applied has been proposed as a method for suppressing such a plating void (Patent Literature 1). Furthermore, a multilayer wiring board to which a method of carrying out the formation of an electrolytic plating layer in two divided portions is applied from the viewpoint of surface smoothness has been proposed as to the filling-in of the hole for interlayer connection (Patent Literature 2).

CITATION LIST

Patent Literature

Patent Literature 1: Japanese Unexamined Patent Publication No. 2003-318544
Patent Literature 2: Japanese Unexamined Patent Publication No. 2009-21581

SUMMARY OF INVENTION

Technical Problem

For a hole for interlayer connection that is formed by laser processing according to a conformal method or a direct laser method, an overhang of a metal foil appears at the opening of the hole for interlayer connection serving as an entrance of laser processing, and due to this overhang of the metal foil, the opening in the cross-sectional shape of the hole for interlayer connection may be rather narrower than the inside or the bottom. In the case of filling such a hole for interlayer connection with electrolytic filling plating, an electrolytic filling plating layer deposited on the overhang of the metal foil at the opening blocks the opening of the hole for interlayer connection before the electrolytic filling plating fills the inside of the hole for interlayer connection, and is partly responsible for the occurrence of a plating void.

In recent years, a demand for miniaturization or thin models has been increasingly growing, and there is a tendency that the diameter of the hole for interlayer connection is smaller, the insulating layer thickness is thinner, and the aspect ratio is larger. Along with this, the overhang of the metal foil at this opening becomes relatively large with respect to the diameter or the depth of the hole for interlayer connection and therefore has larger influence on the occurrence of a plating void. It is also considered that the void that occurs in the inside of the interlayer connection causes problems by use for a long time or use under severe conditions.

In the method of Patent Literature 1, a method for suppressing void occurrence by controlling an electric current density is disclosed as a method for manufacturing a multilayer wiring board having a multilayer structure prepared by alternately laminating an insulating layer consisting of an organic insulating material such as polyimide resin, and a wiring pattern consisting of a conductor material such as copper. However, as a result of studies of the present inventor, the void was unable to be completely eliminated. Furthermore, in the method of Patent Literature 2, an effect of suppressing void occurrence was not obtained, though the amount of a depression generated was reduced.

An object of the present invention is to provide a multilayer wiring board capable of suppressing a plating void in an electrolytic filling plating layer even for a hole for interlayer connection having a diameter nearly equal to an insulating layer thickness.

Solution to Problem

The present invention relates to the following:
1. A multilayer wiring board comprising: a laminate formed by integrally laminating an inner layer material with an inner layer wiring pattern formed thereon, an insulating layer, and a metal foil for an upper layer wiring pattern; a hole for interlayer connection penetrating the metal foil for an upper layer wiring pattern and the insulating layer of the laminate; an overhang of the metal foil for an upper layer wiring pattern formed at an opening of the hole for interlayer connection; lower space formed between the overhang of the metal foil and an inside wall of the hole for interlayer connection; and interlayer connection in which the hole for interlayer connection is filled with electrolytic filling plating layers, wherein the electrolytic filling plating layers that fill the hole for interlayer connection are formed as at least two or more layers, the lower space between the overhang of the metal foil for an upper layer wiring pattern formed at the opening of the hole for interlayer connection and the inside wall of the hole for interlayer connection is filled with any electrolytic filling plating layer except for an outermost layer of the two or more layers of electrolytic filling plating layers, and a maximum diameter in the inside of the interlayer connection formed by any electrolytic filling plating layer except for an outermost layer is equal to or larger than a minimum diameter of the opening.

2. The multilayer wiring board according to item 1, wherein the interlayer connection formed by any electrolytic filling plating layer except for an outermost layer of the two or more layers of electrolytic filling plating layers has an octopus trap (tako-tsubo) shape in which the electrolytic filling plating fills the lower space between the overhang of the metal foil for an upper layer wiring pattern formed at the opening of the hole for interlayer connection and the inside wall of the hole for interlayer connection, and the maximum diameter in the inside of the interlayer connection is larger than the minimum diameter of the opening.

3. The multilayer wiring board according to item 1 or 2, wherein the electrolytic filling plating layers that fill the hole for interlayer connection are formed as two layers, the lower space between the overhang of the metal foil for an upper layer wiring pattern formed at the opening of the hole for interlayer connection and the inside wall of the hole for interlayer connection is filled with the lower electrolytic filling plating layer of the two layers of electrolytic filling plating layers, and the maximum diameter in the inside of the interlayer connection formed by the lower electrolytic filling plating layer is equal to or larger than the minimum diameter of the opening.

4. The multilayer wiring board according to any one of items 1 to 3, wherein the hole for interlayer connection is a non-through hole that penetrates the metal foil for an upper layer wiring pattern and the insulating layer of the laminate and reaches the inner layer wiring pattern.

5. The multilayer wiring board according to any one of items 1 to 4, wherein the aspect ratio of the hole for interlayer connection is 1.0 or more.

Advantageous Effects of Invention

According to the present invention, a multilayer wiring board capable of suppressing a plating void in an electrolytic filling plating layer even for a hole for interlayer connection having a diameter nearly equal to an insulating layer thickness can be provided.

DESCRIPTION OF EMBODIMENTS

Multilayer Wiring Board

Figure 1:
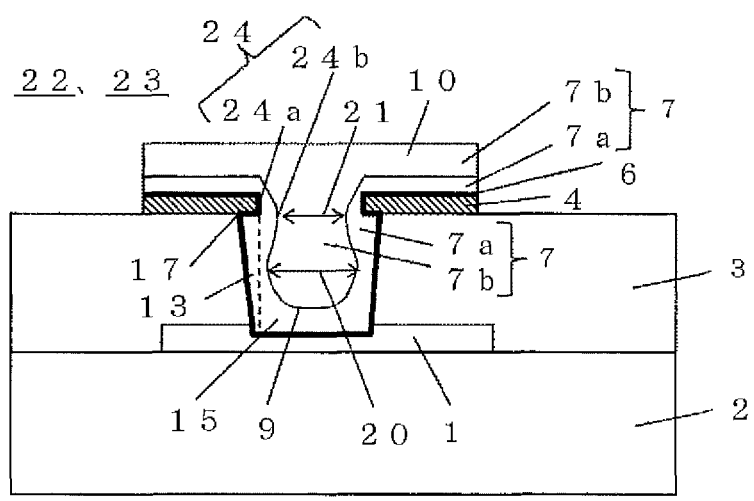
FIG. 1 shows a multilayer wiring board of one embodiment (Examples 1 to 5) of the present invention.

One embodiment of the multilayer wiring board of the present invention includes, as shown in FIG. 1, a multilayer wiring board 23 comprising: a laminate 22 formed by integrally laminating an inner layer material 2 with an inner layer wiring pattern 1 formed thereon, an insulating layer 3, and a metal foil 4 for an upper layer wiring pattern 10; a hole 5 for interlayer connection penetrating the metal foil 4 for an upper layer wiring pattern 10 and the insulating layer 3 of this laminate 22; an overhang 12 of the metal foil 4 for an upper layer wiring pattern 10 formed at an opening of this hole 5 for interlayer connection; lower space 13 formed between this overhang 12 of the metal foil 4 and an inside wall 18 of the hole 5 for interlayer connection; and interlayer connection 15 in which the hole 5 for interlayer connection is filled with electrolytic filling plating layers 7a and 7b, wherein the electrolytic filling plating layers 7a and 7b that fill the hole 5 for interlayer connection are formed as at least two or more layers, the lower space 13 between the overhang 12 of the metal foil 4 for an upper layer wiring pattern 10 formed at the opening of the hole 5 for interlayer connection and the inside wall 18 of the hole 5 for interlayer connection is filled with the electrolytic filling plating layer 7a as any layer except for an outermost electrolytic filling plating layer 7b of the two or more layers of electrolytic filling plating layers 7a and 7b, and a maximum diameter 20 in the inside of the interlayer connection 15 formed by any electrolytic filling plating layer 7a or 7b except for an outermost layer is equal to or larger than a minimum diameter 21 of the opening.

The laminate according to the present embodiment is formed by integrally laminating an inner layer material with an inner layer wiring pattern formed thereon, an insulating layer, and a metal foil for an upper layer wiring pattern.

The inner layer material is one that is used in a general inner layer of a multilayer wiring board and is generally prepared by integrally laminating a metal foil consisting of copper, aluminum, brass, nickel, iron, or the like alone, as an alloy, or as a composite foil on the upper surface and/or lower surface of a required number of a prepreg having a reinforcing base material impregnated with a resin composition (resin-impregnated base material), and forming a wiring pattern serving as an inner layer wiring pattern by the etching or the like of the metal foil.

The prepreg is one that serves as an insulating layer bonding the inner layer material to a copper foil for an upper layer wiring pattern, and refers to a resin film that is in a semi-cured B-stage state by impregnating a reinforcing base material such as glass fiber with a resin composition (resin varnish) and has adhesiveness. A prepreg that is used in a general multilayer wiring board can be employed as the prepreg. Alternatively, a resin film having no reinforcing base material such as glass fiber may be used instead of the prepreg. Examples of such a resin film having no reinforcing base material such as glass fiber include polymer epoxy resins and thermoplastic polyimide adhesive films, which are used for bonding an inner layer material to a copper foil for an upper layer wiring pattern in a multilayer wiring board.

A publicly known and conventional resin composition that is used as an insulating material of a multilayer wiring board can be used as the resin composition mentioned above. Usually, a thermosetting resin having favorable heat resistance and chemical resistance is used as a base, and one type or two or more types of resins such as phenol resin, epoxy resin, polyimide resin, unsaturated polyester resin, polyphenylene oxide resin, and fluorine resin are mixed and used, and, if necessary, supplemented with an inorganic powder filler such as talc, clay, silica, alumina, calcium carbonate, aluminum hydroxide, antimony trioxide, or antimony pentoxide, or a fibrous filler such as glass fiber, asbestos fiber, pulp fiber, synthetic fiber, or ceramic fiber.

Also, a thermoplastic resin may be blended with the resin composition in consideration of dielectric characteristics, impact resistance, film processability, etc. Further, various additives such as an organic solvent, a flame retardant, a curing agent, a curing accelerator, a thermoplastic particle, a colorant, a UV-opaque agent, an antioxidant, and a reducing agent, or fillers are added and prepared, if necessary.

A woven fabric, nonwoven fabric, paper, a mat, or the like of inorganic fiber such as glass or asbestos, organic fiber such as polyester, polyamide, polyacryl, polyvinyl alcohol, polyimide, or fluorine resin, or natural fiber such as cotton is used as the reinforcing base material mentioned above.

Usually, the reinforcing base material is impregnated or coated such that the amount of the resin composition attached to the reinforcing base material becomes 20 to 90% by mass in terms of a resin content of the prepreg after drying, and then dried by heating usually at a temperature of 100 to 200° C. for 1 to 30 minutes to obtain a prepreg in a semi-cured state (B-stage state). Integral lamination is performed by heating and pressurization in a constitution in which 1 to 20 such prepregs are usually layered and metal foils are disposed on both surfaces thereof.

An approach for usual laminated plates can be applied as molding conditions for performing the integral lamination. Usually, molding is performed at a temperature of 100 to 250° C. and a pressure of 2 to 100 kg/cm$^2$ (0.2 to 9.8 MPa) for a heating time in the range of 0.1 to 5 hours by using, for example, a multiplaten press, a multiplaten vacuum press, continuous molding, or an autoclave molding machine, or carried out under lamination conditions of 50 to 150° C. and 0.1 to 5 MPa and under reduced pressure or atmospheric conditions by using a vacuum lamination apparatus or the like. Although the thickness of the prepreg serving as an insulating layer differs depending on use, one having a thickness of 0.1 to 5.0 mm is usually preferred.

The metal foil can employ a foil of a metal that is used in a general multilayer wiring board. It is preferred in terms of electric characteristics that the surface roughness of the metal foil used in the present invention should be 2.0 μm or less for both surfaces in terms of ten point mean roughness (Rz) shown in JIS B0601. A copper foil, a nickel foil, an aluminum foil, or the like can be used as the metal foil, and a copper foil is usually employed.

Conditions involving 50 to 100 g/L of sulfuric acid, 30 to 100 g/L of copper, a solution temperature of 20° C. to 80° C. and an electric current density of 0.5 to 100 A/dm$^2$ in the case of a copper sulfate bath, or conditions involving 100 to 700 g/L of potassium pyrophosphate, 10 to 50 g/L of copper, a solution temperature of 30° C. to 60° C., pH of 8 to 12, and an electric current density of 1 to 10 A/dm$^2$ in the case of a copper pyrophosphate bath are generally often used as manufacturing conditions for the copper foil, and various additives may be added in consideration of the physical properties or smoothness of copper.

The hole for interlayer connection is formed so as to become a non-through hole that penetrates the metal foil for an upper layer wiring pattern and the insulating layer of the laminate and reaches the inner layer wiring pattern, or a through-hole that further penetrates the inner layer wiring pattern and reaches the underside. The hole for interlayer connection according to the present embodiment is a non-through hole or a through-hole for forming interlayer connection, i.e., a so-called via hole, and refers to a state before a plating layer is formed. The hole for interlayer connection can be formed by applying, for example, a conformal method or a direct laser method.

An overhang of the metal foil for an upper layer wiring pattern is formed at the opening of the hole for interlayer connection. This overhang of the metal foil is attributed to the better laser processability (lower thermal decomposition temperature) of the insulating layer than that of the metal foil. The overhang of the metal foil is formed by using a conformal mask method of carrying out the laser processing of an insulating layer with the end of an opening (window hole) disposed in a metal foil as a mask, or a direct laser method of laser-processing a metal foil and an insulating layer without creating an opening in the metal foil.

Lower space is formed between the overhang of the metal foil and the inside wall of the hole for interlayer connection. In the present embodiment, the lower space is space enclosed between the overhang of the metal foil for an upper layer wiring pattern and the inside wall of the hole for interlayer connection, and more specifically refers to space enclosed between a perpendicular drawn from the edge of the overhang of the metal foil for an upper layer wiring pattern to the bottom of the hole for interlayer connection and the inside wall of the hole for interlayer connection.

Interlayer connection is formed by filling the hole for interlayer connection with electrolytic filling plating layers. In the present embodiment, the interlayer connection is one for connecting two or more layers of wiring layers, and becomes a filled via in which the inside of the hole for interlayer connection is completely filled in with the plating layers. One in which the diameter (diameter of the metal foil opening) of the interlayer connection is from nearly equal to the thickness (depth of the hole for interlayer connection) of the insulating layer to about twice this thickness is likely to form the filled via. However, if the diameter (diameter of the metal foil opening) approaches a value nearly equal to the thickness (depth of the hole for interlayer connection) of the insulating layer, i.e., the ratio of the thickness of the insulating layer to the diameter of the interlayer connection (aspect ratio) approaches 1.0, a void easily occurs in conventional methods.

An electroless plating layer is formed as a base for the electrolytic filling plating layers. This electroless plating layer is an electroless plating layer disposed throughout the surface of a substrate after creating the hole for interlayer connection, and the surface of the metal foil for an upper layer wiring pattern, the intra-hole lateral face of the hole for interlayer connection, the inner layer wiring pattern surface on the bottom face within the hole for interlayer connection, etc., is plated. This electroless plating layer can be formed by using an electroless copper plating solution of thin coating type that is generally used in the manufacture of a multilayer wiring board.

The electrolytic filling plating layer refers to an electrolytic plating layer formed by an electrolytic filling plating solution. As for the thickness of the electrolytic filling plating layer, the thickness on the bottom face within the hole for interlayer connection is larger than the thickness on the metal foil for an upper layer wiring pattern.

The electrolytic filling plating solution is generally one in which a plating inhibitor that inhibits plating growth and a plating accelerator that accelerators plating growth have been added into a copper sulfate plating bath.

The plating inhibitor is difficult to adsorb on the inside of the hole for interlayer connection and easy to adsorb on substrate surface according to the diffusion rule of materials. By applying this, it is reportedly effective to fill the inside of the hole for interlayer connection with an electrolytic filling copper plating layer and form a smooth electrolytic filling copper plating layer on substrate surface at an immediately upper portion of the hole for interlayer connection and a portion other than the immediately upper portion of the hole for interlayer connection, by slowing down the plating growth rate of the substrate surface compared with the inside of the hole for interlayer connection. A polyether compound such as polyalkylene glycol, a nitrogen-containing compound such as a quaternary polyvinyl imidazolium compound or a copolymer of vinyl pyrrolidone and a quaternary vinyl imidazolium compound, or the like can be used as the plating inhibitor.

The plating accelerator is uniformly adsorbed on the bottom face and the lateral face within the hole for interlayer connection, and substrate surface, and subsequently, the surface area is decreased in the inside of the hole for interlayer connection with plating growth so that the distribution of the accelerator within the hole for interlayer connection becomes dense. By utilizing this, it is reportedly effective to fill the inside of the hole for interlayer connection with an electrolytic filling copper plating layer and form a smooth electrolytic filling copper plating layer on substrate surface at an immediately upper portion of the hole for interlayer connection and a portion other than the immediately upper portion of the hole for interlayer connection, as a result of accelerating the plating rate in the inside of the hole for interlayer connection compared with the plating rate of the substrate surface. A sulfur compound represented by sodium 3-mercapto-1-propanesulfonate or sodium 2-mercaptoethanesulfonate, or a sulfur compound represented by disodium bis-(3-sulfopropyl)-disulfide or the like can be used as the plating accelerator. These plating accelerators are also one type of additive that is called a brightener and added to a copper plating solution.

One or two or more of these plating inhibitors or plating accelerators are mixed and used. Their concentrations in aqueous solutions are not particularly limited, but can be used at a concentration of several ppm by mass to several % by mass.

In the present embodiment, the electrolytic filling plating layers that fill the hole for interlayer connection are formed as at least two or more layers, the lower space between the overhang of the metal foil for an upper layer wiring pattern formed at the opening of the hole for interlayer connection and the inside wall of the hole for interlayer connection is filled with any electrolytic filling plating layer except for an outermost layer of the two or more layers of electrolytic filling plating layers, and a maximum diameter in the inside of the interlayer connection formed by any electrolytic filling plating layer except for an outermost layer is equal to or larger than a minimum diameter of the opening.

In the multilayer wiring board of the present embodiment, the opening of the hole for interlayer connection has the overhang of the metal foil for an upper layer wiring pattern, and the lower space is formed between this overhang of the metal foil for an upper layer wiring pattern and the inside wall of the hole for interlayer connection. An immediately lower portion, which is a region near the underside of the overhang of the metal foil for an upper layer wiring pattern becomes a region that resists the entrance of current of the electrolytic filling plating solution, in the lower space. Therefore, the lower space including this immediately lower portion is susceptible to the adsorption of the accelerator in the electrolytic filling plating solution, and at the initial stage of the electrolytic filling plating, an electrolytic filling plating layer is first formed in the lower space with this immediately lower portion as a starting point so that the lower space is filled. Once the plating accelerator is adsorbed, it has the property of remaining as it is as long as the electrolytic filling plating is continued at the same electric current density. Therefore, if the electrolytic filling plating is continued at the same electric current density and the electrolytic filling plating layer that fills the hole for interlayer connection is a single layer as in conventional techniques, the filling plating layer that has finished the filling of the lower space keeps growing with the immediately lower portion as a starting point and blocks the opening prior to the inside of the hole for interlayer connection. Therefore, there is a tendency that a plating void easily occurs in the inside of the hole for interlayer connection.

The immediately lower portion refers to a region near the underside of the overhang of the metal foil for an upper layer wiring pattern, in the lower space formed between the overhang of the metal foil for an upper layer wiring pattern and the inside wall of the hole for interlayer connection. This immediately lower portion is formed by the denting of the inside wall of the insulating layer immediately below the metal foil compared with the tip of the metal foil opening, because there is a large difference in laser processability (thermal decomposition temperature) between the resin constituting the insulating layer and the immediately upper metal foil in the case of forming the hole for interlayer connection by a conformal method or a direct laser method. Particularly, in the case of using a prepreg having reinforcing fiber as an insulating layer, a resin for bonding exists in the immediately lower portion of the metal foil, and this resin is more laser-processable than the reinforcing fiber. Thus, there is a tendency that the resin of the immediately lower portion is largely dented compared with the inside wall of the metal foil or in the inside of the hole for interlayer connection. Therefore, the accelerator in the electrolytic filling plating solution is easily adsorbed on this immediately lower portion. Therefore, there is a tendency that the electrolytic filling plating layer grows fast (thick) and blocks the opening of the hole for interlayer connection.

According to the multilayer wiring board of the present embodiment, since the electrolytic filling plating layers that fill the hole for interlayer connection are formed as at least two or more layers, the accelerator adsorbed on the electrolytic filling plating layer formed at the immediately lower portion of the lower space can be separated when the electric current density of electrolytic filling plating is temporarily decreased in the middle of the electrolytic filling plating. In this respect, as long as the electrolytic filling plating layer fills the lower space, and the diameter in the inside of the hole for interlayer connection is equal to or larger than the diameter of the opening (plating opening), the plating inhibitor is easily adsorbed on the opening of the hole for interlayer connection corresponding to the immediately lower portion whereas the plating accelerator is easily adsorbed on the inside of the hole for interlayer connection. This effect is larger, particularly, for an octopus trap (takotsubo) shape in which the electrolytic filling plating layer fills the lower space, and the diameter in the inside of the interlayer connection is larger than the diameter of the opening (plating opening). In this context, the plating opening refers to a site that has become narrowest by the formation of the electrolytic filling plating layer at the metal foil opening. Therefore, since the growth of the electrolytic filling plating layer with the immediately lower portion as a starting point is inhibited after increasing the electric current density of electrolytic filling plating again, the electrolytic filling plating layer is preferentially formed in the inside of the hole for interlayer connection without blocking the opening of the hole for interlayer connection. Thus, even for a hole for interlayer connection having a diameter nearly equal to an insulating layer thickness, i.e., a hole for interlayer connection having an aspect ratio of approximately 1.0, it becomes possible to suppress a plating void in the electrolytic filling plating layer.

The thickness of the electrolytic filling plating layer of the first stage is preferably 1 to 10 μm, more preferably in the range of 2 to 5 μm, as a thickness on the metal foil for an upper layer wiring pattern, and is provided so as to be in the range of approximately 2 to 20 μm as a thickness on the inner layer wiring pattern on the bottom face within the hole for interlayer connection. Also, as for the thickness of the electrolytic filling plating layer of the second stage, the thickness on the metal foil for an upper layer wiring pattern is not limited as long as it can be employed as a wiring pattern and the hole for interlayer connection can be completely filled in with the electrolytic filling plating layers. For the thickness on the metal foil for an upper layer wiring pattern, it is preferred to be in the range of 1 to 100 μm, and it is more preferred to be in the range of 10 to 50 μm.

(Method for Manufacturing Multilayer Wiring Board)

The method for manufacturing a multilayer wiring board of the present embodiment is a method for manufacturing a multilayer wiring board, comprising: (1) a step of integrally laminating an inner layer material with an inner layer wiring pattern formed thereon, an insulating layer, and a metal foil for an upper layer wiring pattern, and providing the metal foil for an upper layer wiring pattern and the insulating layer with a hole for interlayer connection from the metal foil for an upper layer wiring pattern to the inner layer wiring pattern, an overhang of the metal foil for an upper layer wiring pattern formed at an opening of this hole for interlayer connection, and lower space formed between this overhang of the metal foil and an inside wall of the hole for interlayer connection by using a conformal method or a direct laser method; (2) a step of forming a base electroless plating layer within the hole for interlayer connection and on the metal foil for an upper layer wiring pattern, then filling in the hole for interlayer connection by forming electrolytic filling plating layers, and forming interlayer connection that connects the metal foil for an upper layer wiring pattern and the inner layer wiring pattern; and (3) a step of wiring the metal foil for an upper layer wiring pattern after the formation of the electrolytic filling plating layers to form the upper layer wiring pattern, wherein the filling-in of the hole for interlayer connection by the formation of electrolytic filling plating layers in the step (2) is carried out by temporarily decreasing the electric current density of electrolytic filling plating in the middle of the electrolytic filling plating and increasing it again.

In the method for manufacturing a multilayer wiring board of the present embodiment, since the hole for interlayer connection is created in the step (1) by using a conformal method or a direct laser method, an overhang of the metal foil for an upper layer wiring pattern develops at the opening (opening of the metal foil) of the hole for interlayer connection, and lower space is formed between this overhang of the metal foil for an upper layer wiring pattern and the inside wall of the hole for interlayer connection. An immediately lower portion, which is a region near the underside of the overhang of the metal foil for an upper layer wiring pattern, becomes a region that resists the entrance of current of the electrolytic filling plating solution, in the lower space. Therefore, the lower space including this immediately lower portion is susceptible to the adsorption of the accelerator in the electrolytic filling plating solution, and at the initial stage of the electrolytic filling plating, an electrolytic filling plating layer is first formed in the lower space with this immediately lower portion as a starting point so that the lower space is filled. In this context, the lower space is space enclosed between the overhang of the metal foil for an upper layer wiring pattern and the inside wall of the hole for interlayer connection, and more specifically refers to space enclosed between a perpendicular drawn from the edge of the overhang of the metal foil for an upper layer wiring pattern to the bottom of the hole for interlayer connection and the inside wall of the hole for interlayer connection. Once the plating accelerator is adsorbed, it has the property of remaining as it is as long as the electrolytic filling plating is continued at the same electric current density. Therefore, if the electrolytic filling plating is continued at the same electric current density as in conventional techniques, the filling plating layer that has finished the filling of the lower space keeps growing with the immediately lower portion as a starting point and blocks the opening prior to the inside of the hole for interlayer connection. Therefore, there is a tendency that a plating void easily occurs in the inside of the hole for interlayer connection.

According to the method for manufacturing a multilayer wiring board of the present embodiment, the accelerator adsorbed on the electrolytic filling plating layer formed at the immediately lower portion of the lower space can be separated when the electric current density of electrolytic filling plating is temporarily decreased in the middle of the electrolytic filling plating. In this respect, as long as the electrolytic filling plating layer fills the lower space, and the diameter in the inside of the hole for interlayer connection is equal to or larger than the diameter of the opening (opening at a site that has become narrowest by the formation of the electrolytic filling plating layer of the first stage at the opening of the metal foil before temporarily decreasing the electric current density), the plating inhibitor is easily adsorbed on the opening of the hole for interlayer connection corresponding to the immediately lower portion whereas the plating accelerator is easily adsorbed on the inside of the hole for interlayer connection. This effect is larger, particularly, for an octopus trap (tako-tsubo) shape in which the electrolytic filling plating layer fills the lower space, and the diameter in the inside of the interlayer connection is larger than the diameter of the opening (opening at a site that has become narrowest by the formation of the electrolytic filling plating layer of the first stage at the opening of the metal foil before temporarily decreasing the electric current density). Therefore, since the growth of the electrolytic filling plating layer with the immediately lower portion as a starting point is inhibited after increasing the electric current density of electrolytic filling plating again, the electrolytic filling plating layer is preferentially formed in the inside of the hole for interlayer connection without blocking the opening of the hole for interlayer connection. Thus, even for a hole for interlayer connection having a diameter nearly equal to an insulating layer thickness, it becomes possible to suppress a plating void in the electrolytic filling plating layer.

In the step (2), the timing of temporarily decreasing the electric current density of electrolytic filling plating is set to when the electrolytic filling plating fills the lower space between the overhang of the metal foil for an upper layer wiring pattern formed at the opening of the hole for interlayer connection and the inside wall of the hole for interlayer connection, and the diameter in the inside of the interlayer connection is equal to or larger than the diameter of the opening, in terms of the cross-sectional shape of the interlayer connection. As long as the electrolytic filling plating layer fills the lower space, and the diameter in the inside of the hole for interlayer connection is equal to or larger than the diameter of the opening as mentioned above, the plating inhibitor can be more easily adsorbed on the opening of the hole for interlayer connection whereas the accelerator can be more easily adsorbed on the inside of the hole for interlayer connection. This effect is larger, particularly, for an octopus trap (tako-tsubo) shape in which the electrolytic filling plating layer fills the lower space, and the diameter in the inside of the interlayer connection is larger than the diameter of the opening.

In the step (2), the timing of temporarily decreasing the electric current density of electrolytic filling plating is set to before the electrolytic filling plating fills the lower space between the overhang of the metal foil for an upper layer wiring pattern formed at the opening of the hole for interlayer connection and the inside wall of the hole for interlayer connection, and a plating void is formed. By this, the inside of the hole for interlayer connection can be more reliably filled with the electrolytic filling plating layers.

In the step (2), it is desirable that the rate of decrease in electric current density in temporarily decreasing the electric current density of electrolytic filling plating in the middle of the electrolytic filling plating should be 50% or more of that immediately before the decrease. In this context, the rate of decrease in electric current density is percentage by which the electric current density is decreased, and means that, for example, in the case where the rate of decrease from an initial electric current density of 1 A/dm2 is 50%, the electric current density after the decrease is 0.5 A/dm2. Also, decreasing the electric current density includes adjusting the electric current density to 0 A/dm2. By this, the plating accelerator adsorbed on the electrolytic filling plating layer formed at the immediately lower portion of the lower space can be reliably separated. Therefore, as long as the electrolytic filling plating layer fills the lower space, and the diameter in the inside of the hole for interlayer connection is equal to or larger than the diameter of the opening, the plating inhibitor can be more easily adsorbed on the opening of the hole for interlayer connection whereas the accelerator can be more easily adsorbed on the inside of the hole for interlayer connection. This effect is larger, particularly, for an octopus trap (tako-tsubo) shape in which the electrolytic filling plating layer fills the lower space, and the diameter in the inside of the interlayer connection is larger than the diameter of the opening.

In the step (2), it is desirable that the electric current density in, after temporarily decreasing the electric current density of electrolytic filling plating in the middle of the electrolytic filling plating and then increasing it again should be equal to or larger than the electric current density immediately before the temporal decrease. By this, the inside of the hole for interlayer connection can be filled with the electrolytic filling plating layers in a shorter time, and production efficiency is improved.

Furthermore, in the case of temporarily decreasing the electric current density in the middle of electrolytic filling copper plating as in the method for manufacturing a multilayer wiring board of the present invention, a streak is observed between an electrolytic filling copper plating layer of the first stage and an electrolytic filling copper plating layer of the second stage. By this streak, the boundary of the electrolytic filling copper plating layer of the first stage and the electrolytic copper plating layer of the second stage can be identified. As a result, whether or not the electrolytic filling copper plating layer of the first stage fills the lower space, and the diameter in the inside of the interlayer connection is equal to or larger than the diameter of the opening can be confirmed from the cross-sectional shape of the interlayer connection. Thus, it is also easy to control the conditions of the electrolytic filling copper plating of the first stag or the thickness of the electrolytic filling copper plating layer of the first stage.

The hole for interlayer connection may be any of a through-hole and a non-through hole, but it is desirable to be a non-through hole. In forming the non-through hole by applying the conformal method or the direct laser method, the overhang of the metal foil for an upper layer wiring pattern develops at the opening of the hole for interlayer connection, and the lower space is easily formed between this overhang of the metal foil for an upper layer wiring pattern and the inside wall of the hole for interlayer connection. Furthermore, in the case where the hole for interlayer connection is a non-through hole, because of having a bottom, the inside of the hole for interlayer connection is more easily filled with the electrolytic filling plating layers by the action of the plating accelerator in the electrolytic filling plating solution, and a void in the hole for interlayer connection can be more reliably suppressed.

Hereinafter, the method for manufacturing a multilayer wiring board of one embodiment of the present invention will be described with reference to FIGS. 2 to 4.

Figure 2:
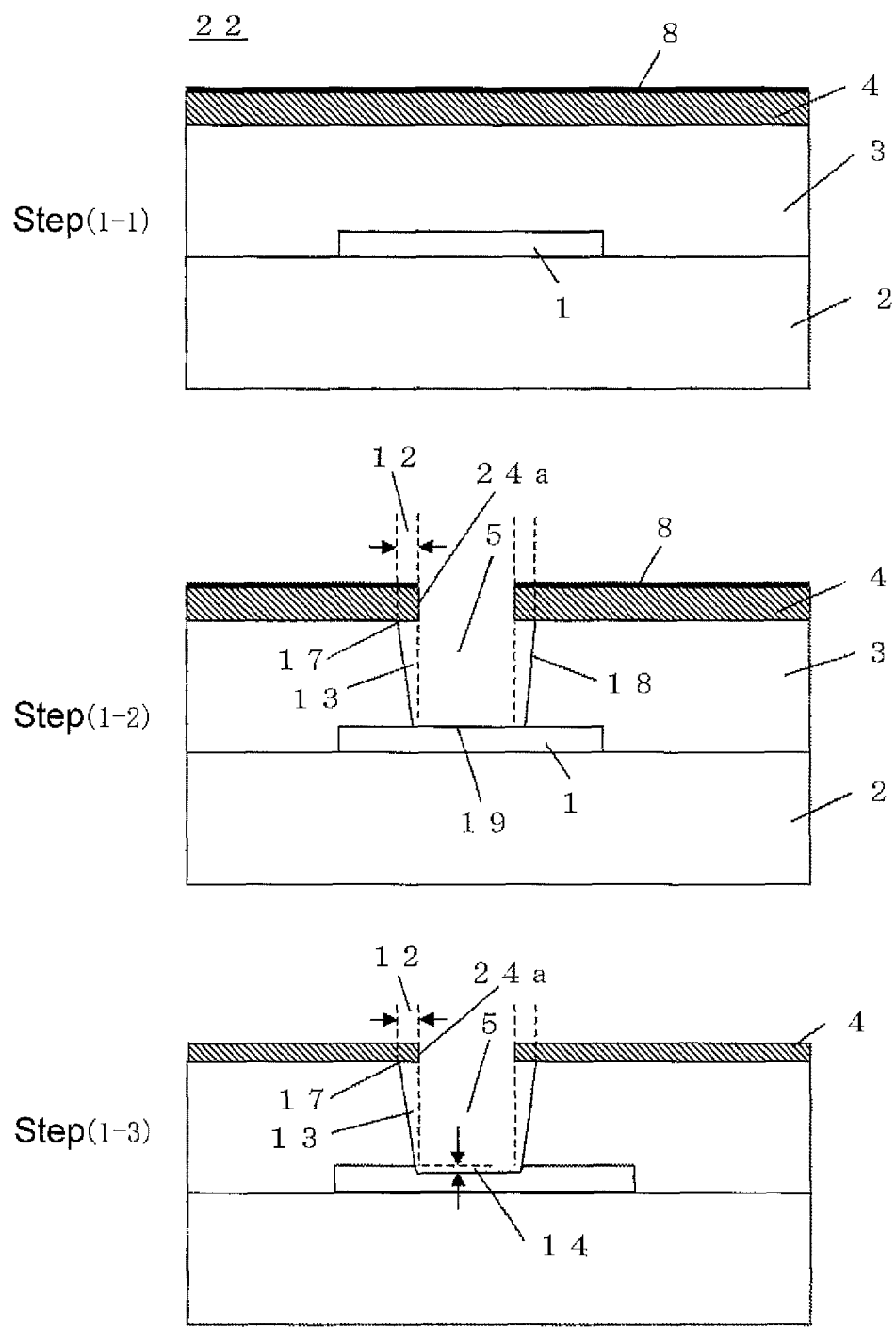
FIG. 2 shows step (1) of a method for manufacturing a multilayer wiring board of one embodiment (Examples 1 to 5) of the present invention.

First, as shown in step (1-1) of FIG. 2, a prepreg 3 on an inner layer material 2 with an inner layer wiring pattern 1 formed thereon, and a copper foil 4 for an upper layer wiring pattern 10 as an upper layer thereof are integrally laminated, and the copper foil 4 for an upper layer wiring pattern 10 is provided with a blackened layer 8. Then, as shown in step (1-2) of FIG. 2, a hole 5 for interlayer connection is created by direct laser processing. An overhang 12 of the copper foil 4 for an upper layer wiring pattern 10 develops at an opening of the hole 5 for interlayer connection, and lower space 13 is formed between this overhang 12 of the copper foil 4 for an upper layer wiring pattern 10 and an inside wall 18 of the hole 5 for interlayer connection. The amount of this overhang (length of the overhang) of the copper foil 4 is 3 to 10 μm. Also, an immediately lower portion 17 is formed in a region near the underside of the overhang 12 of the copper foil 4 for an upper layer wiring pattern 10, in the lower space 13 formed between the overhang 12 of the copper foil 4 for an upper layer wiring pattern 10 and the inside wall 18 of the hole 5 for interlayer connection. In the present embodiment, the prepreg 3, which is a resin film having a reinforcing base material such as glass fiber, is used as the insulating layer 3 that bonds the inner layer material 2 to the copper foil 4 for an upper layer wiring pattern 10, while a resin film, such as a polymer epoxy resin or a thermoplastic polyimide adhesive film, which is used in a general multilayer wiring board and has no reinforcing base material can be used instead of this prepreg 3. Also, in the present embodiment, the copper foil 4 is used as the metal foil 4 for an upper layer wiring pattern 10, while a nickel foil, an aluminum foil, a composite foil thereof, or the like, which is used as a material for a multilayer wiring board can be used instead of this. Furthermore, the insulating layer 3 and the metal foil 4 may be formed by using a resin film having a reinforcing base material on the copper foil 4, or a single-sided copper foil-clad resin film in which a resin film having no reinforcing base material is disposed.

The method for integrally laminating the prepreg on the wired inner layer material, and the copper foil as an upper layer thereof employs a method of laminating and pressing the inner layer material, the prepreg, and the copper foil, or a method of laminating a single-sided copper foil-clad resin film with the inner layer material. The thickness of the insulating layer is approximately 10 to 100 μm, desirably 20 to 60 μm, and the thickness of the copper foil is 3 to 12 μm.

In the present embodiment, since the prepreg is used as the insulating layer, the single-sided copper foil-clad resin film in this case is one having a constitution in which the prepreg (resin film having a reinforcing base material) is disposed on the copper foil. In the case of using a resin film having no reinforcing base material instead of the prepreg as the insulating layer, one in which a resin film, such as a polymer epoxy resin or a thermoplastic polyimide adhesive film, having no reinforcing base material is disposed on the copper foil is used.

The copper foil and the resin composition (resin varnish) that are used in the production of the single-sided copper foil-clad resin film employ similar ones to those used in a general multilayer wiring board. For example, the resin composition (resin varnish) is applied onto the copper foil by using a kiss coater, a roll coater, a comma coater, or the like, or a resin film in which the resin composition has a film shape in a B-stage state (semi-cured state) is laminated onto the copper foil. When the resin composition (resin varnish) is applied onto the copper foil, the resin varnish is heated and dried in order to create a B-stage state (semi-cured state). 1 to 30 minutes at a temperature of 100 to 200° C. are appropriate as this condition, and approximately 0.2 to 10% by mass is appropriate as the amount of a residual solvent in the resin composition (resin varnish) after the heating and drying. In the case of laminating the film-shaped resin onto the metal foil, conditions of 50 to 150° C. and 0.1 to 5 MPa and vacuum or atmospheric conditions are appropriate.

The blackened layer that is formed on the copper foil for an upper layer wiring pattern layer can be formed with a publicly known one that is formed for bonding the copper foil and the insulating layer in a general multilayer wiring board. Examples of such a blackened layer include one formed by forming asperities on the surface of the copper foil by copper oxide treatment or etching.

Furthermore, the laser that can be used in the formation of the hole for interlayer connection includes gas laser such as $CO_2$, CO, or excimer, and solid laser such as YAG. $CO_2$ laser easily obtains large output, and according to a direct laser method under development in recent years, the processing of a hole for interlayer connection having a diameter of 50 μm or smaller is also possible.

Next, as shown in step (1-3) of FIG. 2, half etching is performed with an etching solution such as an aqueous ferric chloride solution, sodium persulfate, or a sulfuric acid-hydrogen peroxide water mixed aqueous solution until the thickness of the copper foil 4 for an upper layer wiring pattern 10 mentioned above becomes approximately 1 to 5 μm. By this treatment, the blackened layer 8 formed on the copper foil 4 is removed. Also, a bottom 19 is etched in the interlayer connection 15 so that a depression 14 occurs. By securing the amount of this depression 14 (amount of etching), laser processing residues on the bottom 19 of the interlayer connection 15 can be removed, and reliability can be secured.

Next, resin residues present on the bottom of the hole 5 for interlayer connection are removed by carrying out desmear treatment. Then, as shown in step (2-1) of FIG. 3, catalytic nuclei are imparted onto the copper foil 4 and to the inside of the hole 5 for interlayer connection, and then, an electroless copper plating layer 6 is formed. For example, Activator Neoganth (trade name, manufactured by Atotech Japan K.K.; "Neoganth" is a registered trademark), which is a palladium ion catalyst, or HS201B (trade name, manufactured by Hitachi Chemical Co., Ltd.), which is a palladium colloid catalyst, is employed for the imparting of the catalytic nuclei. The amount of the palladium catalyst adsorbed onto the copper foil 4 in the present embodiment is in the range of 0.03 to 0.6 μg/cm², further desirably in the range of 0.05 to 0.3 μg/cm². The treatment temperature in adsorbing the palladium catalyst is preferably 10 to 40° C. The amount of the palladium catalyst adsorbed onto the copper foil 4 can be controlled by controlling the treatment time.

Furthermore, a commercially available electroless copper plating solution such as CUST2000 (trade name, manufactured by Hitachi Chemical Co., Ltd.; "CUST" is a registered trademark) or CUST201 (trade name, manufactured by Hitachi Chemical Co., Ltd.) can be employed in the formation of the electroless copper plating layer. These electroless copper plating solutions are composed mainly of copper sulfate, formalin, a complexing agent, and sodium hydroxide. The thickness of the electroless copper plating layer needs only to be a thickness that can perform feeds for forming a next electrolytic filling copper plating layer, and is in the range of 0.1 to 5 more preferably in the range of 0.5 to 1.0 μm.

Figure 3:
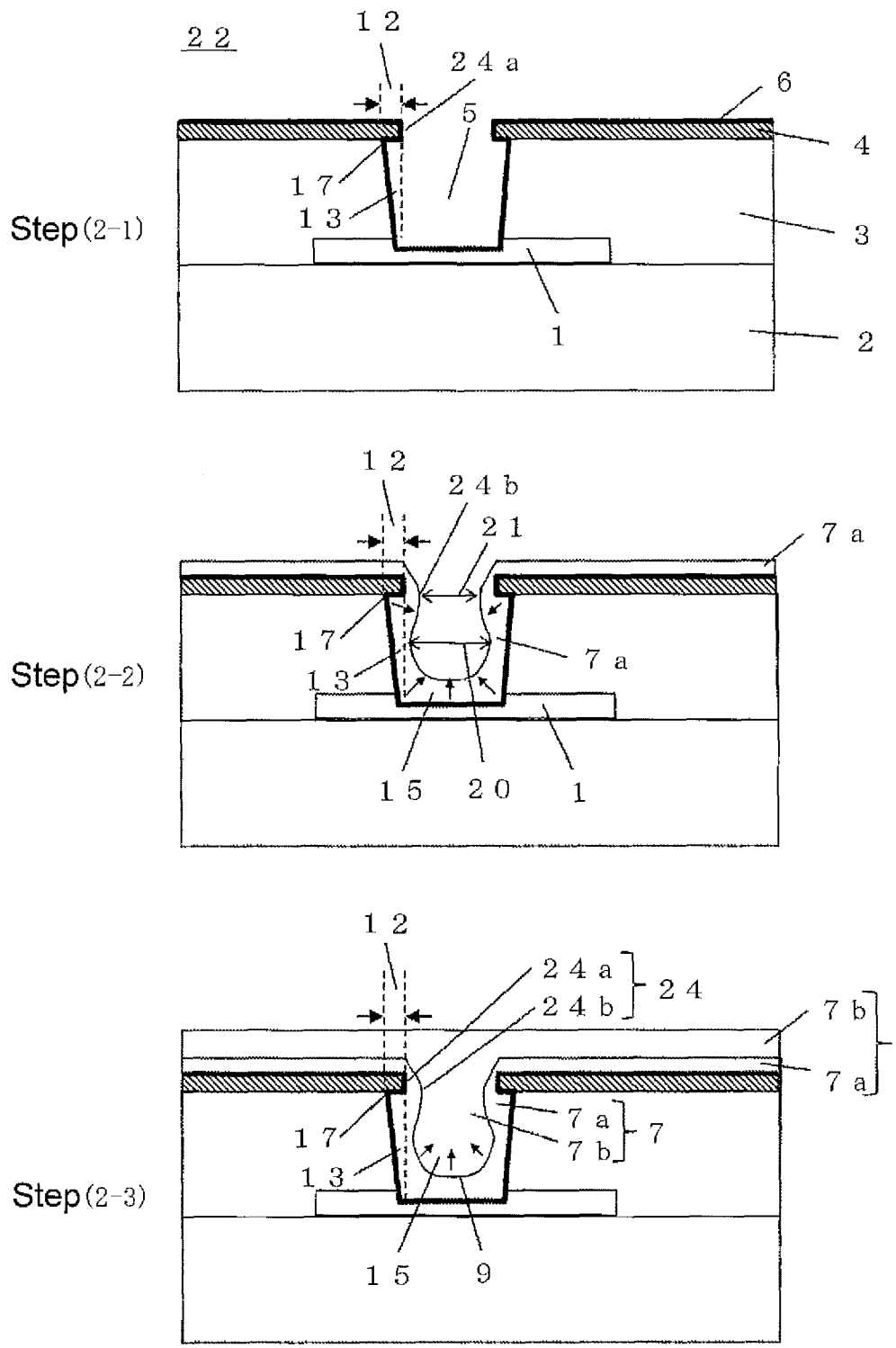
FIG. 3 shows step (2) of the method for manufacturing a multilayer wiring board of one embodiment (Examples 1 to 5) of the present invention.

Next, as shown in step (2-2) of FIG. 3, an electrolytic filling copper plating layer 7a of the first stage is formed on the formed electroless copper plating layer 6 to the extent that the hole 5 for interlayer connection is not completely filled in. More specifically, a state is created in which the electrolytic filling copper plating layer 7a of the first stage fills the lower space 13, and a diameter 20 in the inside of the interlayer connection 15 is equal to or larger than a diameter 21 of the opening (plating opening 24b). Particularly, an octopus trap (tako-tsubo) shape in which the electrolytic filling copper plating layer 7a of the first stage fills the lower space 13, and the diameter 20 in the inside of the interlayer connection 15 is larger than the diameter 21 of the opening (plating opening 24b) is more preferred. As for the thickness of the electrolytic filling copper plating layer 7a of the first stage, the thickness of the electrolytic filling copper plating layer 7a of the first stage on a bottom face 19 within the hole 5 for interlayer connection is larger than the thickness of the electrolytic filling copper plating layer 7a of the first stage on the copper foil 4 for an upper layer wiring pattern 10, and the thickness on the copper foil 4 for an upper layer wiring pattern 10 is in the range of 1.0 to 5.0 μm while the thickness on the bottom face 19 within the hole 5 for interlayer connection is provided in the range of approximately 1 to 20 μm. Conditions for such electrolytic filling copper plating are approximately 4 to 20 minutes at an electric current density of 1.0 A/dm².

Figure 7:
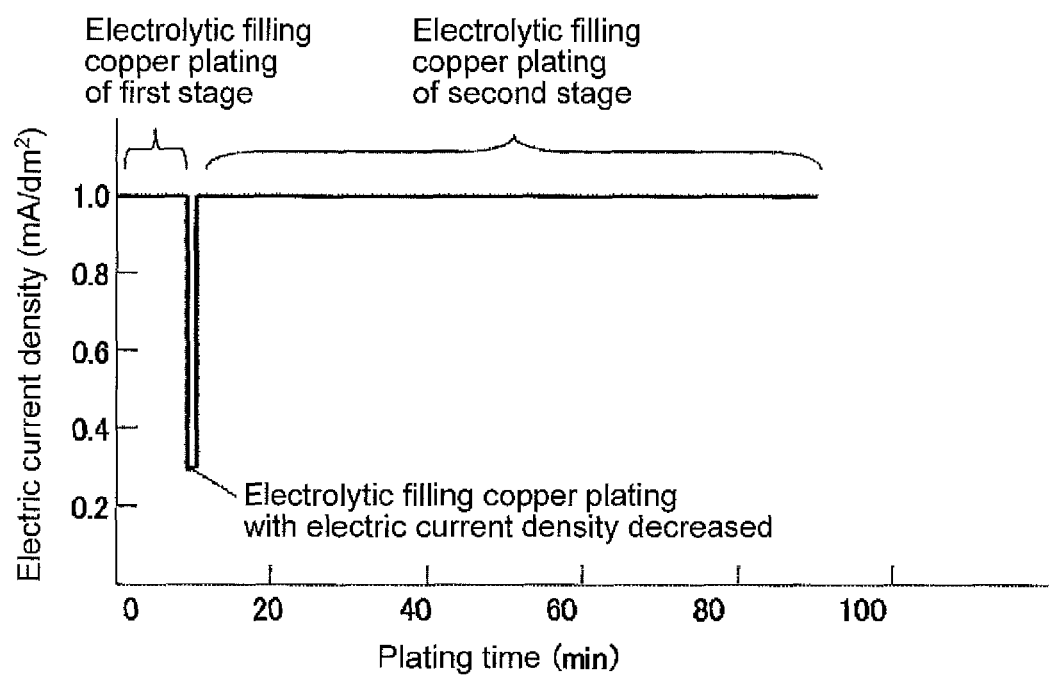
FIG. 7 shows the electric current density of electrolytic filling plating in a method for manufacturing a multilayer wiring board of one embodiment (Example 2) of the present invention.

Next, as shown in FIG. 7, the electric current density of electrolytic filling copper plating of the first stage is temporarily decreased to 0.3 A/dm² in the middle of the electrolytic filling copper plating of the first stage, and the electrolytic filling plating with the electric current density decreased is carried out for approximately 1 minute. By this, the plating accelerator adsorbed on the electrolytic filling plating layer 7a of the first stage formed in the lower space 13 can be separated. The time of carrying out this electrolytic filling plating with the electric current density decreased, i.e., the time of maintaining the temporarily decreased electric current density of electrolytic filling copper plating has an effect of separating the plating accelerator if it is 1 second or longer, and 10 minutes or shorter are preferred because it precludes large reduction in the working efficiency of the electrolytic filling copper plating. In terms of the cross-sectional shape of the interlayer connection 15 immediately before thus temporarily decreasing the electric current density, as shown in step (2-2) of FIG. 3, the lower space 13 formed between the overhang 12 of the copper foil 4 for an upper layer wiring pattern 10 and the inside wall 18 of the hole 5 for interlayer connection is filled with the electrolytic filling copper plating layer 7a of the first stage. In the present embodiment, an octopus trap (tako-tsubo) shape in which the diameter 20 in the inside of the interlayer connection 15 is larger than the diameter 21 of the opening (plating opening 24b) is created. In this way, the cross-sectional shape of the interlayer connection 15 after forming the electrolytic filling plating layer 7a of the first stage has an octopus trap (tako-tsubo) shape in which the electrolytic filling plating layer 7a of the first stage fills the lower space 13, and the diameter 20 in the inside of the interlayer connection 15 is larger than the diameter 21 of the opening (plating opening 24b), whereby the plating inhibitor is easily adsorbed on the opening of the hole 5 for interlayer connection corresponding to the immediately lower portion 17 of the copper foil 4 whereas the plating accelerator is easily adsorbed on the inside of the hole 5 for interlayer connection.

Next, as shown in FIG. 7, the electric current density of electrolytic filling plating is increased again to 1.0 A/dm$^2$, and electrolytic filling copper plating of the second stage is carried out. As shown in step (2-3) of FIG. 3, since the growth of the electrolytic filling plating layer 7b of the second stage with the immediately lower portion 17 as a starting point is inhibited in the electrolytic filling plating of the second stage after increasing the electric current density of electrolytic filling plating again, the electrolytic filling plating layer 7a of the second stage is preferentially formed in the inside of the hole 5 for interlayer connection without blocking the opening of the hole 5 for interlayer connection. Thus, even for a hole 5 for interlayer connection having a diameter nearly equal to an insulating layer 3 thickness, it becomes possible to suppress a plating void 16 in the electrolytic filling plating layer 7b of the second stage. The inside of the hole 5 for interlayer connection is completely filled in with this electrolytic filling copper plating layer 7b of the second stage so that a portion on the hole 5 for interlayer connection serving as the upper layer wiring pattern 10 and a portion other than the hole 5 for interlayer connection are flattened. Copper sulfate electroplating for filled via that is employed in an ordinary multilayer wiring board can be employed in the electrolytic filling plating layer 7b of the second stage, and the electrolytic filling plating solution used in forming the electrolytic filling copper plating layer 7a of the first stage is also acceptable, or a different one is acceptable. When the electrolytic filling copper plating solution that is employed in the formation of the electrolytic filling copper plating layer 7a of the first stage and the electrolytic filling copper plating layer 7b of the second stage is the same, the electrolytic filling copper plating of the first stage, the electrolytic filling copper plating with the electric current density decreased, and the electrolytic filling copper plating of the second stage can be formed in a state dipped in the same electrolytic filling copper plating solution, therefore resulting in good workability. The thickness of the electrolytic filling plating layer 7b of the second stage is not limited as long as it can be employed as a wiring pattern and the hole 5 for interlayer connection can be filled in with the conductor metal. For the thickness on the copper foil 4 for an upper layer wiring pattern 10 and the electrolytic filling copper plating layer 7a of the first stage, it is preferred to be in the range of 1 to 100 µm, and it is more preferred to be in the range of 10 to 50 µm. Conditions for such electrolytic filling copper plating are approximately 4 to 400 minutes, preferably approximately 40 to 200 minutes, at an electric current density of 1.0 A/dm$^2$. In general, because copper is deposited more thick on the bottom of the hole 5 for interlayer connection than the surface in electrolytic filling copper plating, an aspect in filling in the inside of the hole 5 for interlayer connection with the electrolytic filling copper plating 9 of the second stage is reduced.

Although the filling-in of the hole for interlayer connection by the formation of electrolytic filling plating layers in the present embodiment is carried out in two divided stages, the filling-in of the hole for interlayer connection is not limited to two stages and may be carried out two or more divided stages. In the case of carrying out the filling-in of the hole for interlayer connection in two or more divided stages, the suppression of a void becomes easier by temporarily decreasing the electric current density of electrolytic filling copper plating before formation of the electrolytic filling plating layer at each of the second and later stages.

Figure 4:
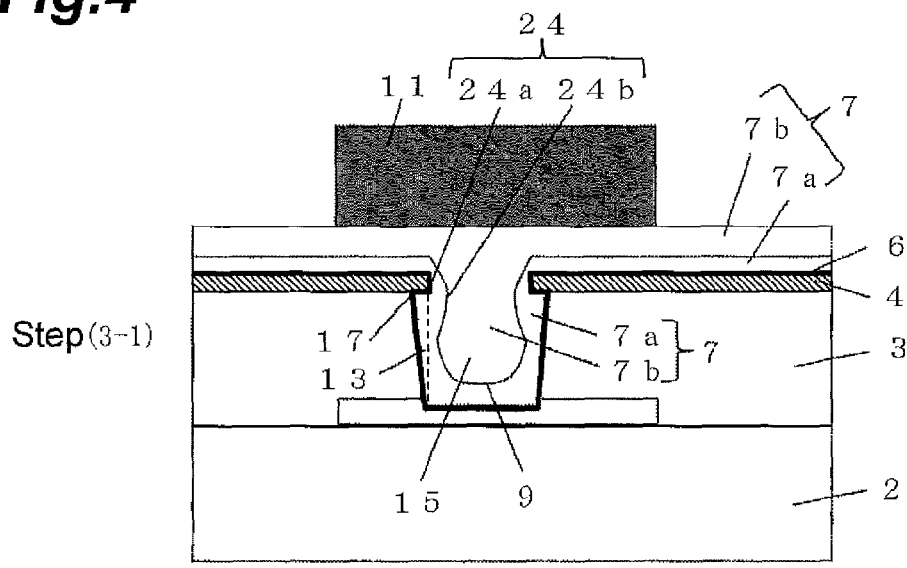
FIG. 4 shows step (3) of the method for manufacturing a multilayer wiring board of one embodiment (Examples 1 to 5) of the present invention.
Figure 4:
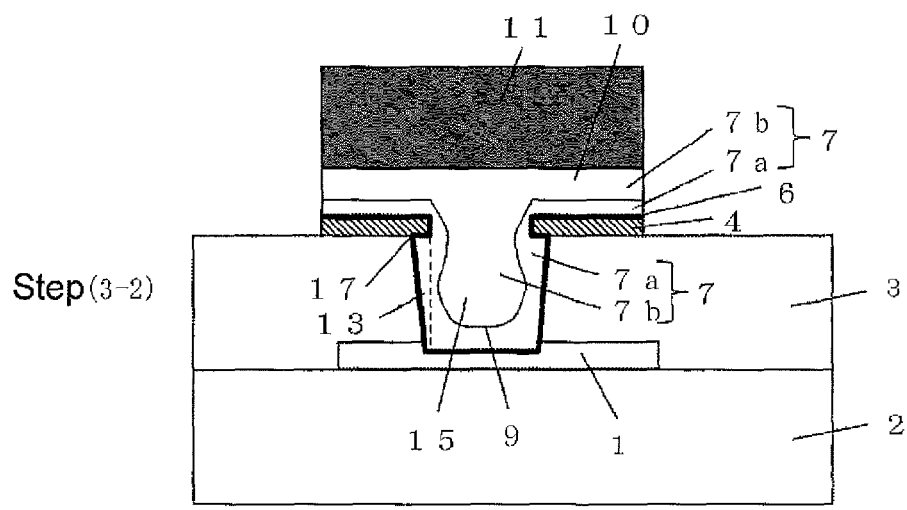
Figure 4:
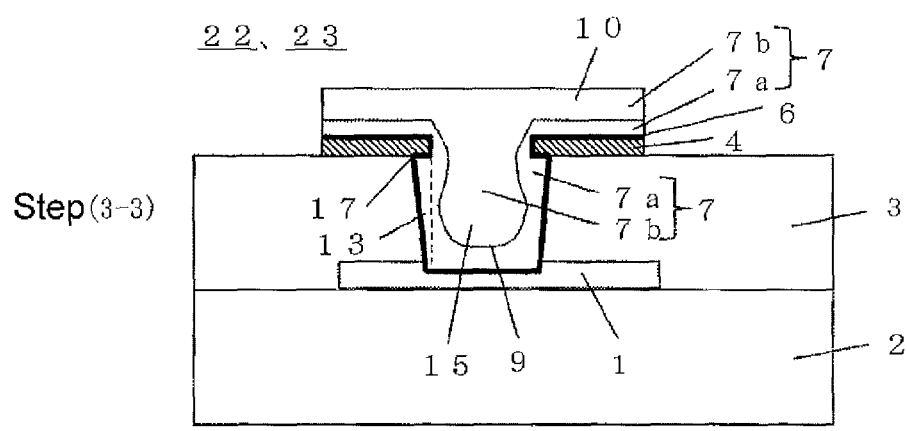

Next, as shown in step (3-1) of FIG. 4, an etching resist 11 is formed by using a dry film resist or the like. The etching resist 11 is removed by development, except for a site on the hole 5 for interlayer connection and a site that should become the upper layer wiring pattern 10.

Next, as shown in step (3-2) of FIG. 4, a portion other than the upper layer wiring pattern 10 is removed by etching, and then, the stripping of the etching resist 11 is carried out by using an alkaline stripping solution, sulfuric acid, or a commercially available resist stripping solution to form the upper layer wiring pattern 10. By the method shown above, a multilayer wiring board 23 consisting of two-layer wiring patters of the inner layer wiring pattern 1 and the upper layer wiring pattern 10 is finished. In the case of producing a multilayer wiring board having a larger number of layers of wiring patterns, the surface of the upper layer wiring pattern 10 of this multilayer wiring board 23 is roughened, for example, to improve the adhesiveness with an insulating layer (not shown) formed on this upper layer wiring pattern 10, while a prepreg and a copper foil for an upper layer wiring pattern on its upper layer are laminated, for example, for production.

EXAMPLES

Hereinafter, the present invention will be described with reference to Examples, and however, the present invention is not intended to be limited by the present Examples.

Example 1

First, as shown in step (1-1) of FIG. 2, a single-sided copper foil-clad resin film in which the thickness of a resin film serving as an insulating layer 3 was 30 µm, and the thickness of a copper foil 4 serving as a copper foil 4 for an upper layer wiring pattern 10 was 5 µm was vacuum-laminated on an inner layer material 2 with an inner layer wiring pattern 1 formed thereon under conditions of 120° C. and 2 MPa. Next, a blackened layer 8 having a thickness of 0.3 to 0.5 µm was formed on the surface of this copper foil 4 for an upper layer wiring pattern 10. Then, as shown in step (1-2) of FIG. 2, a hole 5 for interlayer connection having a diameter (diameter of a copper foil opening 24a) of 35 µm was processed by the direct laser method with $CO_2$ laser. Specifically, this hole 5 for interlayer connection had a depth of 35 µm in which the thickness (30 µm) of the resin film and the thickness (5 µm) of the copper foil 4 were summed, and the diameter of the copper foil opening 24*a* was 35 µm. Therefore, the aspect ratio was approximately 1.0. An overhang 12 of the copper foil 4 for an upper layer wiring pattern 10 developed at an opening 24 of the hole 5 for interlayer connection, and lower space 13 was formed between this overhang 12 of the copper foil 4 for an upper layer wiring pattern 10 and an inside wall 18 of the hole 5 for interlayer connection. The amount of the overhang of the copper foil 4 was approximately 8 µm on one side of the hole 5 for interlayer connection. Also, an immediately lower portion 17 was formed in a region near the underside of the overhang 12 of the copper foil 4 for an upper layer wiring pattern 10, in the lower space 13 formed between the overhang 12 of the copper foil 4 for an upper layer wiring pattern 10 and the inside wall 18 of the hole 5 for interlayer connection.

Next, as shown in step (1-3) of FIG. 2, half etching was performed with an etching solution such as an aqueous ferric chloride solution, ammonium persulfate, or a sulfuric acid-hydrogen peroxide water mixed aqueous solution until the thickness of the copper foil 4 became 2 to 3 µm in order to remove the blackened layer 8 on the copper foil 4 for an upper layer wiring pattern 10.

Next, resins attached to the bottom of the hole 5 for interlayer connection were removed by carrying out desmear treatment. Then, as shown in step (2-1) of FIG. 3, catalytic nuclei were imparted onto the copper foil 4 and to the inside of the hole 5 for interlayer connection by using HS201B (trade name, manufactured by Hitachi Chemical Co., Ltd.), which is a palladium colloid catalyst, and then, an electroless copper plating layer 6 having a thickness of 0.5 µm and serving as a base for electrolytic filling copper plating was formed by using CUST2000 (trade name, manufactured by Hitachi Chemical Co., Ltd.; "CUST" is a registered trademark).

Furthermore, a commercially available electroless copper plating solution such as CUST2000 (trade name, manufactured by Hitachi Chemical Co., Ltd.; "CUST" is a registered trademark) or CUST201 (trade name, manufactured by Hitachi Chemical Co., Ltd.) can be employed in the formation of the electroless copper plating layer. These electroless copper plating solutions are composed mainly of copper sulfate, formalin, a complexing agent, and sodium hydroxide. The thickness of the electroless copper plating layer needs only to be a thickness that can perform feeds for forming a next electrolytic filling copper plating layer, and is in the range of 0.1 to 5 µm, more preferably in the range of 0.5 to 1.0 µm.

Next, as shown in step (2-2) of FIG. 3, an electrolytic filling copper plating layer 7*a* of the first stage of 2 µm as a thickness on the copper foil 4 for an upper layer wiring pattern 10 and 2 to 15 µm as a thickness on the bottom face 19 within the hole 5 for interlayer connection is formed. A commercially available direct current electrolytic plating solution CU-BRITE VFIV (trade name, manufactured by JCU Corp.) was used as an electrolytic filling copper plating solution. In this respect, conditions for the electrolytic filling copper plating of the first stage are approximately 8 minutes at an electric current density of 1.0 A/dm$^2$. In this case, the cross-sectional shape of the interlayer connection 15 in which the electrolytic filling copper plating layer 7*a* of the first stage was formed had an octopus trap (tako-tsubo) shape in which the electrolytic filling plating layer 7*a* of the first stage filled the lower space 13, and the diameter 20 in the inside of the interlayer connection 15 was larger than the diameter 21 of the opening (plating opening 24*b*).

Next, in order to temporarily decrease the electric current density of electrolytic filling copper plating, the power of the rectifier was temporarily turned off, and it was left for 1 minute with 0 A/dm$^2$ kept. Continuously therewith, as shown in step (2-3) of FIG. 3, the filling of the interlayer connection 15 was then carried out with an electrolytic filling copper plating layer 7*b* of the second stage of 18 µm as a thickness on the copper foil 4 for an upper layer wiring pattern 10 and the electrolytic filling copper plating layer 7*a* of the first stage. In this respect, conditions for the electrolytic filling copper plating of the second stage were approximately 80 minutes at an electric current density of 1.0 A/dm$^2$. During this, the substrate remained dipped in the electrolytic filling copper plating solution.

Next, as shown in step (3-1) of FIG. 4, an etching resist 11 having a thickness of 29 µm is formed by using SL-1229 (trade name, Hitachi Chemical Co., Ltd.), which is a dry film resist. The etching resist 11 is removed, except for a site on the hole 5 for interlayer connection and a site that should become the upper layer wiring pattern 10. Next, as shown in step (3-2) of FIG. 4, copper other than the upper layer wiring pattern 10 was removed by etching, and then, the stripping of the etching resist 11 was carried out by using an alkaline stripping solution, sulfuric acid, or a commercially available resist stripping solution to form the upper layer wiring pattern 10.

Example 2

Step (1-1) of FIG. 1 to step (2-1) of FIG. 3 were taken in the same way as in Example 1. Next, as shown in step (2-2) of FIG. 3, an electrolytic filling copper plating layer 7*a* of the first stage of 2 µm as a thickness on the copper foil 4 for an upper layer wiring pattern 10 and 2 to 15 µm as a thickness on the bottom face 19 within the hole 5 for interlayer connection is formed. The same one as in Example 1 was used as an electrolytic filling copper plating solution. In this respect, conditions for the electrolytic filling copper plating of the first stage were approximately 8 minutes at an electric current density of 1.0 A/dm$^2$.

Next, the electric current density of electrolytic filling copper plating was dropped from 1.0 A/dm$^2$ to 0.3 A/dm$^2$, which was kept for 1 minute, while the electrolytic filling copper plating was continued. Continuously therewith, as shown in step (2-3) of FIG. 3, the filling of the interlayer connection 15 was then carried out with an electrolytic filling copper plating layer 7*b* of the second stage of 18 µm as a thickness on the copper foil 4 for an upper layer wiring pattern 10 and the electrolytic filling copper plating layer 7*a* of the first stage. In this respect, conditions for the electrolytic filling copper plating of the second stage were approximately 80 minutes at an electric current density of 1.0 A/dm$^2$. During this, the substrate remained dipped in the electrolytic filling copper plating solution. Next, steps (3-1) to (3-3) of FIG. 4 were taken in the same way as in Example 1.

Example 3

Step (1-1) of FIG. 2 to step (2-1) of FIG. 3 were taken in the same way as in Example 1. Next, as shown in step (2-2) of FIG. 3, an electrolytic filling copper plating layer 7*a* of the first stage of 2 µm as a thickness on the copper foil 4 for an upper layer wiring pattern 10 and 2 to 15 µm as a thickness on the bottom face 19 within the hole 5 for interlayer connection is formed. The same one as in Example 1 was used as an electrolytic plating solution. In this respect, conditions for the electrolytic filling copper plating of the first stage were approximately 8 minutes at an electric current density of 1.0 A/dm$^2$.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 3, the filling of the interlayer connection 15 was then carried out with an electrolytic filling copper plating layer 7b of the second stage of 18 μm as a thickness on the copper foil 4 for an upper layer wiring pattern 10 and the electrolytic filling copper plating layer 7a of the first stage. In this respect, conditions for the electrolytic filling copper plating of the second stage were approximately 80 minutes at an electric current density of 1.0 A/dm$^2$. During this, the substrate remained dipped in the electrolytic filling copper plating solution. Next, steps (3-1) to (3-3) of FIG. 4 were taken in the same way as in Example 1.

Example 4

Step (1-1) of FIG. 2 to step (2-1) of FIG. 3 were taken in the same way as in Example 1. Next, as shown in step (2-2) of FIG. 3, an electrolytic filling copper plating layer 7a of the first stage of 2 μm as a thickness on the copper foil 4 for an upper layer wiring pattern 10 and 2 to 15 μm as a thickness on the bottom face 19 within the hole 5 for interlayer connection is formed. The same one as in Example 1 was used as an electrolytic plating solution. In this respect, conditions for the electrolytic filling copper plating of the first stage were approximately 8 minutes at an electric current density of 1.0 A/dm2.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 3, the filling of the interlayer connection 15 was then carried out with an electrolytic filling copper plating layer 7b of the second stage of 18 μm as a thickness on the copper foil 4 for an upper layer wiring pattern 10 and the electrolytic filling copper plating layer 7a of the first stage. In this respect, conditions for the electrolytic filling copper plating of the second stage were approximately 56 minutes at an electric current density of 1.5 A/dm$^2$. During this, the substrate remained dipped in the electrolytic filling copper plating solution. Next, steps (3-1) to (3-3) of FIG. 4 were taken in the same way as in Example 1.

Example 5

Step (1-1) of FIG. 2 to step (2-1) of FIG. 3 were taken in the same way as in Example 1. Next, as shown in step (2-2) of FIG. 3, an electrolytic filling copper plating layer 7a of the first stage of 1 μm as a thickness on the copper foil 4 for an upper layer wiring pattern 10 and 1 to 7 μm as a thickness on the bottom face 19 within the hole 5 for interlayer connection is formed. The same one as in Example 1 was used as an electrolytic filling plating solution. In this respect, conditions for the electrolytic filling copper plating of the first stage were approximately 4 minutes at an electric current density of 1.0 A/dm$^2$.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 3, the filling of the interlayer connection 15 was then carried out with an electrolytic filling copper plating layer 7b of the second stage of 19 μm as a thickness on the copper foil 4 for an upper layer wiring pattern 10 and the electrolytic filling copper plating layer 7a of the first stage. In this respect, conditions for the electrolytic filling copper plating of the second stage were approximately 84 minutes at an electric current density of 1.0 A/dm$^2$. During this, the substrate remained dipped in the electrolytic filling copper plating solution. Next, steps (3-1) to (3-3) of FIG. 4 were taken in the same way as in Example 1.

Comparative Example 1

Figure 6:
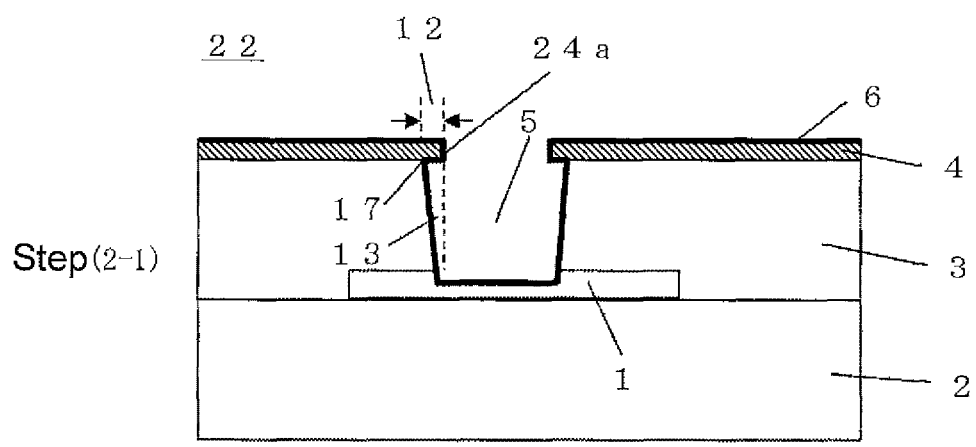
FIG. 6 shows step (2) of a method for manufacturing a multilayer wiring board of Comparative Example 1.
Figure 6:
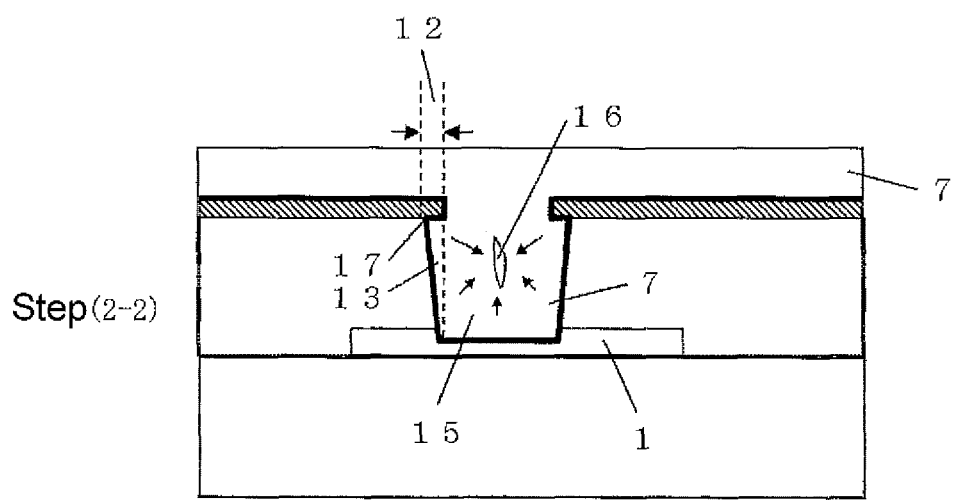

Step (1-1) of FIG. 2 to step (2-1) of FIG. 3 were taken in the same way as in Example 1. Next, as shown in step (2-2) of FIG. 6, an electrolytic filling copper plating layer 7a of the first stage of 20 μm as a thickness on the copper foil 4 for an upper layer wiring pattern 10 was formed in one stage. The same one as in Example 1 was used as an electrolytic filling copper plating solution. In this respect, conditions for the electrolytic filling copper plating of the first stage were approximately 88 minutes at an electric current density of 1.0 A/dm$^2$. Next, steps (3-1) to (3-3) of FIG. 4 were taken in the same way as in Example 1.

Comparative Example 2

Figure 5:
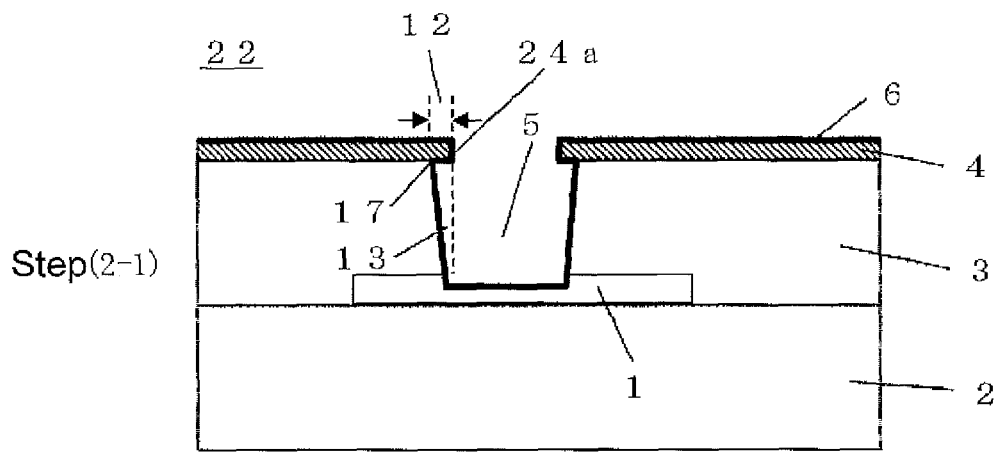
FIG. 5 shows step (2) of a method for manufacturing a multilayer wiring board of Comparative Example 2.
Figure 5:
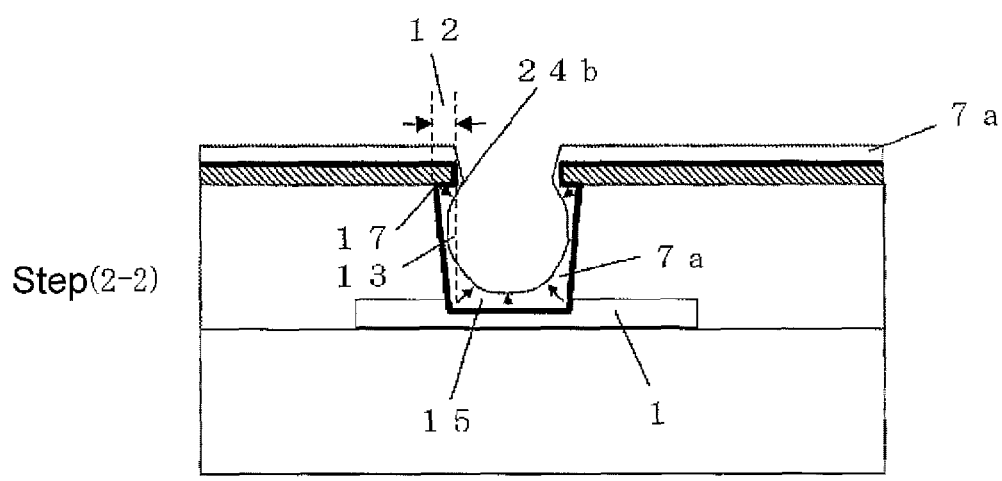
Figure 5:
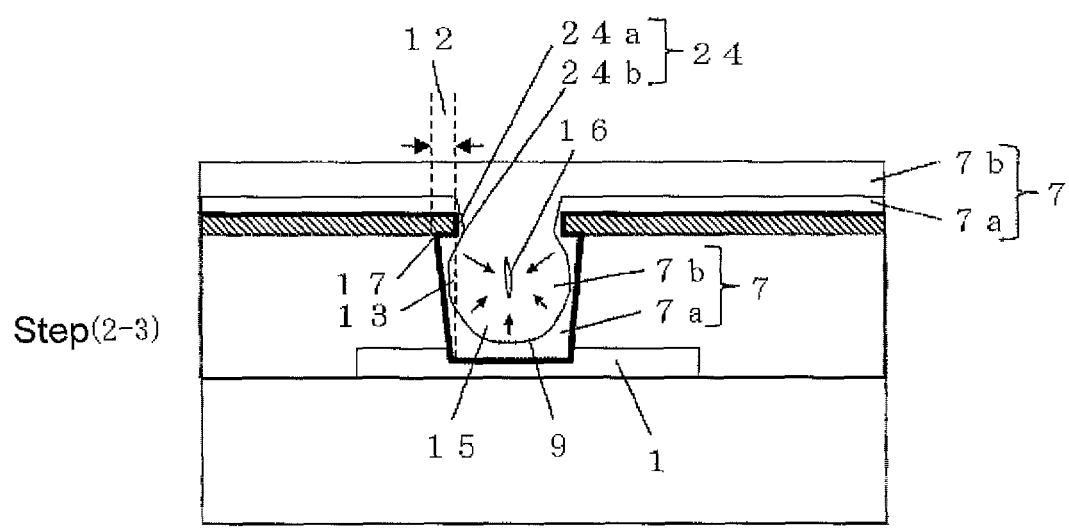

Step (1-1) of FIG. 2 to step (2-1) of FIG. 3 were taken in the same way as in Example 1. Next, as shown in step (2-2) of FIG. 5, an electrolytic filling copper plating layer 1a of the first stage of 0.5 μm as a thickness on the copper foil 4 for an upper layer wiring pattern 10 and 0.5 to 3 μm as a thickness on the bottom face 19 within the hole 5 for interlayer connection is formed. The same one as in Example 1 was used as an electrolytic filling copper plating solution. In this respect, conditions for the electrolytic filling copper plating of the first stage were approximately 2 minutes at an electric current density of 1.0 A/dm$^2$. In this case, the electrolytic filling plating layer 7a of the first stage did not fill the lower space 13, in terms of the cross-sectional shape of the interlayer connection 15 in which the electrolytic filling copper plating layer 7a of the first stage was formed.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 5, the filling of the interlayer connection 15 was then carried out with an electrolytic filling copper plating layer 7b of the second stage of 19.5 μm as a thickness on the copper foil 4 for an upper layer wiring pattern 10 and the electrolytic filling copper plating layer 7a of the first stage. In this respect, conditions for the electrolytic filling copper plating of the second stage were approximately 86 minutes at an electric current density of 1.0 A/dm$^2$. During this, the substrate remained dipped in the electrolytic filling copper plating solution. Next, steps (3-1) to (3-3) of FIG. 4 were taken in the same way as in Example 1.

The occurrence frequency of a plating void was summarized in Table 1 by observing the cross section of the interlayer connection under a microscope in Examples 1 to 5 and Comparative Examples 1 and 2. In Examples 1 to 4, the occurrence frequency of a void was 0%, and the hole for interlayer connection was able to be filled. In Example 5, the rate of occurrence of a void was 6.5%, and the hole for interlayer connection was able to be almost filled. On the other hand, in Comparative Example 1, the occurrence of a void was almost 100%. In Comparative Example 2, the rate of occurrence of a void was 75%. Furthermore, in Examples 1 to 5 and Comparative Examples 2 in which the electric current density was temporarily decreased in the middle of electrolytic filling copper plating, the boundary of plating layers was observed between the electrolytic filling copper plating layer of the first stage and the electrolytic filling copper plating layer of the second stage. By this boundary of plating layers, the boundary of the electrolytic filling copper plating layer of the first stage and the electrolytic copper plating layer of the second stage was able to be identified. As a result, the cross-sectional shape of the interlayer connection in Examples 1 to 5 was able to be confirmed to have an octopus trap (tako-tsubo) shape in which the electrolytic filling copper plating layer of the first stage filled the lower space, and the diameter in the inside of the interlayer connection was larger than the diameter of the opening (plating opening). On the other hand, in the cross-sectional shape of the interlayer connection of Comparative Example 1, the boundary of plating layers indicating the boundary of the electrolytic filling copper plating layer of the first stage and the electrolytic copper plating layer of the second stage found in Examples 1 to 5 was not observed, demonstrating that the electrolytic filling copper plating layer in the lower space starting at the immediately lower portion grew thicker than the other sites in the inside of the interlayer connection and blocked the opening with a void remaining. Also, in the cross-sectional shape of the interlayer connection of Comparative Example 2, the electrolytic filling copper plating layer of the first stage did not fill the lower space. Therefore, as with Comparative Example 1, it was demonstrated that the electrolytic filling copper plating layer of the second stage grew thick in the lower space starting at the immediately lower portion and blocked the opening with a void remaining.

7. Electrolytic filling plating layers or electrolytic filling copper plating layers
7a. Electrolytic filling plating layer of the first stage or electrolytic filling copper plating layer of the first stage
7b. Electrolytic filling plating layer of the second stage or electrolytic filling copper plating layer of the second stage
8. Blackened layer
9. Boundary of plating layers
10. Upper layer wiring pattern
11. Etching resist
12. Overhang of the metal foil or overhang of the copper foil
13. Lower space
14. Depression
15. Interlayer connection
16. Void
17. Immediately lower portion
18. Inside wall
19. Bottom or bottom face
20. Diameter (in the inside)
21. Diameter (of the opening)
22. Laminate
23. Multilayer wiring board
24. Opening
24a. Metal foil opening or copper foil opening
24b. Plating opening

The invention claimed is:
1. A multilayer wiring board comprising:
a laminate formed by integrally laminating an inner layer material with an inner layer wiring pattern formed thereon, an insulating layer, and a metal foil for an upper layer wiring pattern;
a hole for interlayer connection penetrating the metal foil for an upper layer wiring pattern and the insulating layer of the laminate;
an overhang of the metal foil for an upper layer wiring pattern formed at an opening of the hole for interlayer connection;

TABLE 1

| Item | Example 1 | Example 2 | Example 3 | Example 4 | Example 5 | Comparative Example 1 | Comparative Example 2 |
|---|---|---|---|---|---|---|---|
| Electrolytic filling plating of first stage | 1.0 A/dm² × 8 min | 1.0 A/dm² × 8 min | 1.0 A/dm² × 8 min | 1.0 A/dm² × 8 min | 1.0 A/dm² × 4 min | 1.0 A/dm² × 88 min | 1.0 A/dm² × 2 min |
| Electrolytic filling plating with electric current decreased | 0 A/dm² × 1 min | 0.3 A/dm² × 1 min | 0.5 A/dm² × 1 min | 0.5 A/dm² × 1 min | 0.8 A/dm² × 1 min | — | 0.8 A/dm² × 1 min |
| Electrolytic filling plating of second stage | 1.0 A/dm² × 80 min | 1.0 A/dm² × 80 min | 1.0 A/dm² × 80 min | 1.5 A/dm² × 56 min | 1.0 A/dm² × 84 min | — | 1.0 A/dm² × 86 min |
| Rate of occurrence of void | 0% | 0% | 0% | 0% | 6.5% | 100% | 75% |

REFERENCE SIGNS LIST

1. Inner layer wiring pattern
2. Inner layer material
3. Prepreg or insulating layer
4. Metal foil or copper foil
5. Hole for interlayer connection
6. Electroless plating layer or electroless copper plating layer lower space formed between the overhang of the metal foil and an inside wall of the hole for interlayer connection; and
interlayer connection in which the hole for interlayer connection is filled with electrolytic filling plating layers,
wherein the electrolytic filling plating layers that fill the hole for interlayer connection are formed as at least two or more layers, wherein the lower space between the overhang of the metal foil for an upper layer wiring pattern formed at the opening of the hole for interlayer connection and the inside wall of the hole for interlayer connection is filled with any electrolytic filling plating layer except for an outermost layer of the two or more layers of electrolytic filling plating layers, and a maximum diameter in the inside of the interlayer connection formed by any electrolytic filling plating layer except for an outermost layer is equal to or larger than a minimum diameter of the opening.

2. The multilayer wiring board according to claim 1,
wherein the interlayer connection formed by any electrolytic filling plating layer except for an outermost layer of the two or more layers of electrolytic filling plating layers has an octopus trap (tako-tsubo) shape in which the electrolytic filling plating fills the lower space between the overhang of the metal foil for an upper layer wiring pattern formed at the opening of the hole for interlayer connection and the inside wall of the hole for interlayer connection, and the maximum diameter in the inside of the interlayer connection is larger than the minimum diameter of the opening.

3. The multilayer wiring board according to claim 1,
wherein the electrolytic filling plating layers that fill the hole for interlayer connection are formed as two layers,
wherein the lower space between the overhang of the metal foil for an upper layer wiring pattern formed at the opening of the hole for interlayer connection and the inside wall of the hole for interlayer connection is filled with the lower electrolytic filling plating layer of the two layers of electrolytic filling plating layers, and
the maximum diameter in the inside of the interlayer connection formed by the lower electrolytic filling plating layer is equal to or larger than the minimum diameter of the opening.

4. The multilayer wiring board according to claim 1,
wherein the hole for interlayer connection is a non-through hole that penetrates the metal foil for an upper layer wiring pattern and the insulating layer of the laminate and reaches the inner layer wiring pattern.

5. The multilayer wiring board according to claim 1,
wherein the aspect ratio of the hole for interlayer connection is 1.0 or more.

* * * * *